(12) United States Patent
Janesky et al.

(10) Patent No.: US 6,898,112 B2
(45) Date of Patent: May 24, 2005

(54) SYNTHETIC ANTIFERROMAGNETIC STRUCTURE FOR MAGNETOELECTRONIC DEVICES

(75) Inventors: Jason Allen Janesky, Gilbert, AZ (US); Bradley N. Engel, Chandler, AZ (US); Nicholas D. Rizzo, Gilbert, AZ (US); Jon M. Slaughter, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 132 days.

(21) Appl. No.: 10/322,979

(22) Filed: Dec. 18, 2002

(65) Prior Publication Data

US 2004/0120184 A1 Jun. 24, 2004

(51) Int. Cl.[7] .............................................. G11C 11/00
(52) U.S. Cl. ........................ 365/158; 365/171; 365/173
(58) Field of Search ................................. 365/158, 171, 365/173

(56) References Cited

U.S. PATENT DOCUMENTS

| | | | |
|---|---|---|---|
| 6,469,878 B1 | 10/2002 | Mack et al. | |
| 6,545,906 B1 * | 4/2003 | Savtchenko et al. | ........ 365/158 |
| 6,633,498 B1 * | 10/2003 | Engel et al. | ................. 365/158 |
| 2002/0024780 A1 | 2/2002 | Mao et al. | |
| 2002/0038331 A1 | 3/2002 | Nickel et al. | |

* cited by examiner

Primary Examiner—Richard Elms
Assistant Examiner—Pho M. Luu
(74) Attorney, Agent, or Firm—Ingrassia, Fisher & Lorenz, P.C.

(57) ABSTRACT

A nearly balanced synthetic antiferromagnetic (SAF) structure that can be advantageously used in magnetoelectronic devices such as a magnetoresistive memory cell includes two ferromagnetic layers and an antiferromagnetic coupling layer separating the two ferromagnetic layers. The SAF free layer has weakly coupled regions formed in the antiferromagnetic coupling layer by a treatment such as annealing, layering of the antiferromagnetic coupling layer, or forming the antiferromagnetic coupling layer over a roughened surface of a ferromagnetic layer. The weakly coupled regions lower the flop field of the SAF free layer in comparison to untreated SAF free layers. The SAF flop is used during the write operation of such a structure and its reduction results in lower power consumption during write operations and correspondingly increased device performance.

28 Claims, 7 Drawing Sheets

SYNTHETIC ANTIFERROMAGNETIC STRUCTURE FOR MAGNETOELECTRONIC DEVICES

RELATED APPLICATION

This application is related to a co-pending application entitled "A Method Of Writing To A Scalable Magnetoresistance Random Access To Memory Element" U.S. Ser. No. 09/978859 filed on Oct. 16, 2001, assigned to the assignee of the instant application.

This Invention was made with Government support under Agreement No. MDA972-96-3-0016 awarded by DARPA. The Government has certain rights in the invention.

FIELD OF THE INVENTION

This invention relates to semiconductor magnetoeletronic devices, and in particular, the present invention relates to semiconductor structures useful in devices that store a magnetic state.

BACKGROUND OF THE INVENTION

The class of devices that is magnetoelectronic devices is a broad class that includes motors, disk drives, and certain semiconductor memory devices, such as magnetoresistive random access memories (MRAMs), and integrated circuits that include MRAM and logic functions other than MRAM, such as radio and processing circuits. Memory devices of all types are an extremely important component in electronic systems. The three most prevalent semiconductor memory technologies are SRAM (static random access memory), DRAM (dynamic random access memory), and FLASH (a form of non-volatile random access memory), which are essentially non-magnetoelectronic. Each of these memory devices uses an electronic charge to store information and each has its own advantages. SRAM has fast read and write speeds, but it is volatile and requires large cell area. DRAM has high density, but it is also volatile and requires a refresh of the storage capacitor every few milliseconds. This requirement increases the complexity of the control electronics.

FLASH is the major nonvolatile memory device in use today. FLASH uses charge trapped in a floating oxide layer to store information. Drawbacks to FLASH include high voltage requirements and slow program and erase times. Also, FLASH memory has a poor write endurance of $10^4$–$10^6$ cycles before memory failure. In addition, to maintain reasonable data retention, the thickness of the gate oxide has to stay above the threshold that allows electron tunneling, thus restricting FLASH's scaling trends.

To overcome these shortcomings, new magnetic memory devices are being evaluated. One such device is the MRAM, which stores bits as magnetic states. MRAM has the potential to have speed performance similar to DRAM. To be commercially viable, however, MRAM must have comparable memory density to current memory technologies, be scalable for future generations, operate at low voltages, have low power consumption, and have competitive read/write speeds.

A significant amount of power is consumed during a write operation of an MRAM cell in an MRAM device having an array of cells. The write operation consists of passing currents through conductive lines external but in close proximity to the MRAM magnetic element. The magnetic fields generated by these currents are sufficient to switch the magnetic state of the free layer of the magnetic element. In addition, as the bit dimension shrinks, the switching field increases for a given shape and film thickness, requiring more current to switch. As will be discussed in more detail below, data is stored in the magnetization state of the free layer of the magnetic element. Therefore a significant challenge to commercializing MRAM devices is to construct MRAM cells that switch the magnetic state using the lowest possible magnetic field, resulting in the lowest possible write currents, while maintaining the integrity of the data within the entire array of elements It would be highly advantageous, therefore, to remedy the foregoing and other deficiencies inherent in the prior art.

BRIEF DESCRIPTION OF THE DRAWINGS

The present invention is illustrated by way of example and not limitation in the accompanying figures, in which like references indicate similar elements, and in which.

DETAILED DESCRIPTION OF THE DRAWINGS

Figure 1:
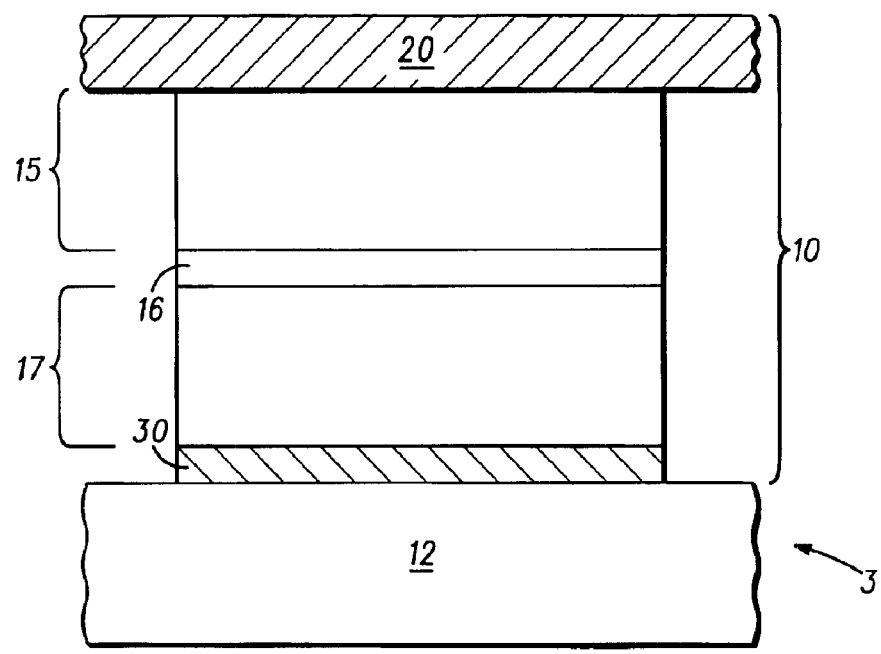
FIG. 1 is a simplified cross-sectional view of a magnetoresistive random access memory (MRAM) device, in accordance with the present invention.

Referring to FIG. 1, a simplified cross-sectional view of a generalized MRAM array 3 is shown, in accordance with the present invention. In this illustration, only a single magnetoresistive memory device (or cell) 10 is shown, but it will be understood that MRAM array 3 consists of a number of MRAM devices 10 and only one such device is shown for simplicity in describing a reading method.

MRAM device 10 is a magnetoresistive tunneling junction memory cell, or magnetoresistive tunneling junction device (MTJD) that comprises material layers sandwiched between writing conductors that are a word line 20 and a digit line 30. Word line 20 and digit line 30 include conductive material through which a current can be passed to induce a magnetic field within the MRAM device 10. In this illustration, word line 20 is positioned on top of MRAM device 10 and digit line 30 is positioned on the bottom of MRAM device 10 and is directed at a 90° angle to word line 20 (See FIG. 3). It will be appreciated that conductors such as word line 20 and digit line 30 need not be in physical contact with the other layers of the MRAM device 10 for efficient reading and writing operation, the conductors just need to be sufficiently near the regions to which the magnetic field is to be applied such that the magnetic field is effective.

MRAM device 10 includes a bit magnetic region 15, a reference magnetic region 17, and an electrically insulating material that forms a layer that acts as a tunneling barrier 16, as well as those portions of the word line 20 and digit line 30 that carry currents that affect the operation of the MRAM device 10. The bit magnetic region 15 and reference magnetic region 17 may each comprise more than one layer, some of which can have a magnetic moment (all magnetic moments are represented herein as vectors) associated therewith. For example, some conventional MRAMs have a bit magnetic region 15 that is a single ferromagnetic layer or a multilayered unbalanced synthetic antiferromagnetic region. Bit magnetic region 15 for the present invention is a nearly balanced multilayer synthetic antiferromagnetic as described below. The bit magnetic region 15 and reference magnetic region 17 are positioned adjacent to the tunneling barrier 16, on opposite sides thereof. A resistance of the MTJD is determined by the relative polarization directions of a bit magnetic moment and a reference magnetic moment directly in contact with the tunnel barrier. The magnetic moment is a physical property of ferromagnetic materials. The magnetic material and the relative angle of polarization of region 15 or 17 directly adjacent to the tunnel barrier determine the high or low state. In the embodiments described herein, the bit magnetic region is a free ferromagnetic region, meaning that the bit magnetic moment is free to rotate in the presence of an applied magnetic field. The bit magnetic moment has two stable polarities (states) in the absence of any applied magnetic fields along a magnetic axis, known herein as the "bit easy axis", determined at the time of deposition of the magnetic material and fabrication of the magnetic regions 15 of the MRAM array 3. An axis orthogonal to the bit easy axis is known as the "hard axis".

Figure 2:
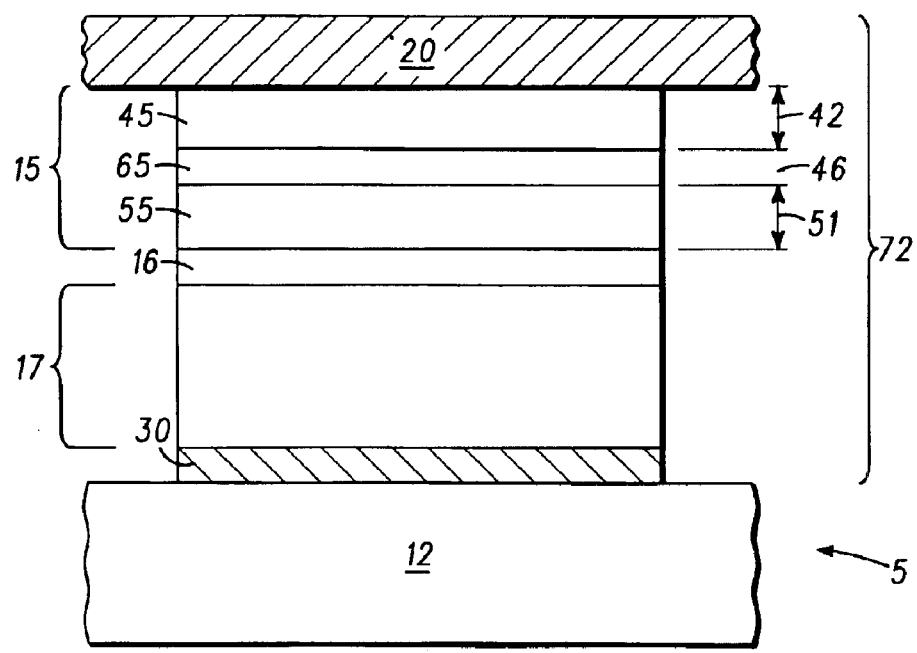
FIG. 2 is a simplified cross-sectional view of an MRAM device, in accordance with embodiments of the present invention that use a Savtchenko writing technique.

Referring to FIG. 2, a cross sectional view of a portion of an MRAM array 5 that includes an MRAM device 72 is shown, in accordance with embodiments of the present invention, which uses a Savtchenko writing technique described herein in some detail with reference to FIGS. 2–11. MRAM device 72 has the structure described with reference to FIG. 1, with a refined description that the bit magnetic region 15 comprises at least three layers and has magnetic moments implemented as with reference to FIGS. 2–11. Bit magnetic region 15 in this example is a tri-layer structure, which has an antiparallel coupling layer 65 sandwiched between two ferromagnetic layers 45 and 55, providing what is known as a synthetic antiferromagnetic (hereinafter referred to as "SAF") layer. The nominal thicknesses 42, 51 of the ferromagnetic layers 45, 55 are in a range from 5 to 150 Angstroms, and the nominal thickness 46 of the antiparallel coupling layer 65 is in a range from 3 to 30 Angstroms. "Nominal" in this context means an approximate, average thickness within normal manufacturing tolerances for the type of material and process used to deposit it.

Ferromagnetic layers 45, 55 have magnetic moments 58 and 53 (see FIG. 3), respectively, that have respective vector values $M_1$ and $M_2$. Further, ferromagnetic layers 45, 55 include at least one of elements Ni, Fe, Co, Mn or combinations thereof. Antiparallel coupling layer 65 includes a material that induces antiferromagnetic exchange coupling (also called herein an antiferromagnetic exchange material) between the ferromagnetic layers 45, 55 or a material that prevents exchange coupling (also called herein a spacing material) between the ferromagnetic layers 45, 55, or both. The antiferromagnetic exchange material comprises one of the elements Ru, Os, Re, Cr, Rh, Cu, Nb, Mo, W, Ir, V, or combinations thereof, and is not by itself an antiferromagnetic material; rather it is a coupling layer that is key to creating the antiferromagnetic-like properties of the SAF layer. The spacing material is an insulator, of which one example is $Al_2O_3$, or a conductor, of which some examples are Ta and Al. The antiparallel coupling layer 65 can comprise two or more layers, each of which may be antiferromagnetic exchange or spacing layers. The magnetic moments 58, 53 are usually oriented anti-parallel due to the coupling of the antiparallel coupling layer 65. The coupling can be induced as when an antiferromagnetic exchange material is used as the antiparallel coupling layer 65, or antiparallel coupling can also be generated by the magnetostatic fields of the ferromagnetic layers in the MRAM device 72. Therefore, the antiparallel coupling layer 65 need not necessarily provide any additional coupling beyond substantially eliminating the ferromagnetic coupling between the two ferromagnetic layers 45, 55 and could therefore be a spacing material, for example, an insulator such as AlO or a conductor such as Ta or Al. For the purposes of explaining the Savtchenko writing technique, there is also defined a net magnetic moment 40 that is the vector resultant of the magnetic moments 58 and 53. Also, it will be understood that bit magnetic region 15 can include synthetic antiferromagnetic layer material structures other than tri-layer structures and the use of tri-layer structures in this embodiment is for illustrative purposes only. For example, one such synthetic antiferromagnetic layer material structure could include a five-layer stack of a ferromagnetic layer/antiparallel coupling layer/ferromagnetic layer/antiparallel coupling layer/ferromagnetic layer structure. The number of ferromagnetic layers is identified as N. To simplify the description, it is assumed hereinafter that N is equal to two so that MRAM device 72 includes one tri-layer structure in bit magnetic region 15 with magnetic moments 53 and 58, as well as a net magnetic moment 40. Also, only the magnetic moments of bit magnetic region 15 are illustrated.

The magnetic moments 58, 53 in the two ferromagnetic layers 45, 55 in the MRAM device 72 can have different thicknesses or material to provide a net magnetic moment 40 given by $\Delta M=(M_2-M_1)$. In this case of Savtchenko writing technology, this tri-layer structure will be nearly balanced; that is, $\Delta M$ is less than 15 percent of the average of $M_2$ and $M_1$ (otherwise simply stated as "the imbalance is less than 15 percent") and is preferably as near to zero as can be economically fabricated in production lots. The magnetic moments of the tri-layer structure of the bit magnetic region 15 are free to rotate with an applied magnetic field. In zero field the bit magnetic moment 58, which is the magnetic moment that is adjacent to the tunneling barrier 16, will be stable in one of two polarized directions along the easy axis.

A measurement current through the MRAM device 72 that is used to read the polarity of the bit magnetic moment 58 depends on the tunneling magnetoresistance, which is governed by the orientation and magnitudes of the bit magnetic moment 58 and a reference magnetic moment of the reference magnetic region 17. When these two magnetic moments are parallel, then the MRAM device resistance is low and a voltage bias will induce a larger measurement current through the MRAM device 72. This state is defined as a "1". When these two magnetic moments are anti-parallel, then the MRAM device resistance is high and an applied voltage bias will induce a smaller measurement current through the device. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moments in region 15 to be orientated either one of parallel and anti-parallel directions along the bit easy axis 59 relative to region 17, and reading the written state relies upon resistance measurements that depend on the polarity of the bit magnetic moment relative to the reference magnetic moment (This same operation is true for all of the MRAM devices described herein)

The method of writing to the MRAM device 72 relies on the phenomenon of "spin-flop" for a nearly balanced SAF tri-layer structure, which is well known to one of ordinary skill in the art. Here, the term "nearly balanced" is defined such that the M1 and M2 are within 15% of one another, and includes the case in which M1 and M2 are essentially equal. The "spin-flop" phenomenon lowers the total magnetic energy in an applied field by rotating the magnetic moments of the ferromagnetic layers so that they are nominally orthogonal to the applied field direction but still predominantly anti-parallel to one another. The rotation, or "flop", combined with a small deflection of each ferromagnetic magnetic moment in the direction of the applied field accounts for the decrease in total magnetic energy.

MRAM device 72 preferably has tri-layer structure that has a non-circular shape characterized by a length/width ratio in a range of 1 to 5. It will be understood that the bit magnetic region 15 of MRAM device 72 can have other shapes, such as square, elliptical, rectangular, or diamond, but it is illustrated as being circular for simplicity.

Further, during fabrication of MRAM array 5, each succeeding layer (i.e. 30, 55, 65, etc.) is deposited or otherwise formed in sequence and each MRAM device 72 may be defined by selective deposition, photolithography processing, etching, etc. in any of the techniques known in the semiconductor industry. During deposition of at least the ferromagnetic layers 45 and 55, a magnetic field is provided to set the bit easy axis. The provided magnetic field creates a preferred anisotropy axis for magnetic moments 53 and 58. The bit easy axis 59 is chosen to be at a 45° angle between word line 20 and digit line 30. It will be appreciated however that angles other than 45° could be used.

Figure 3:
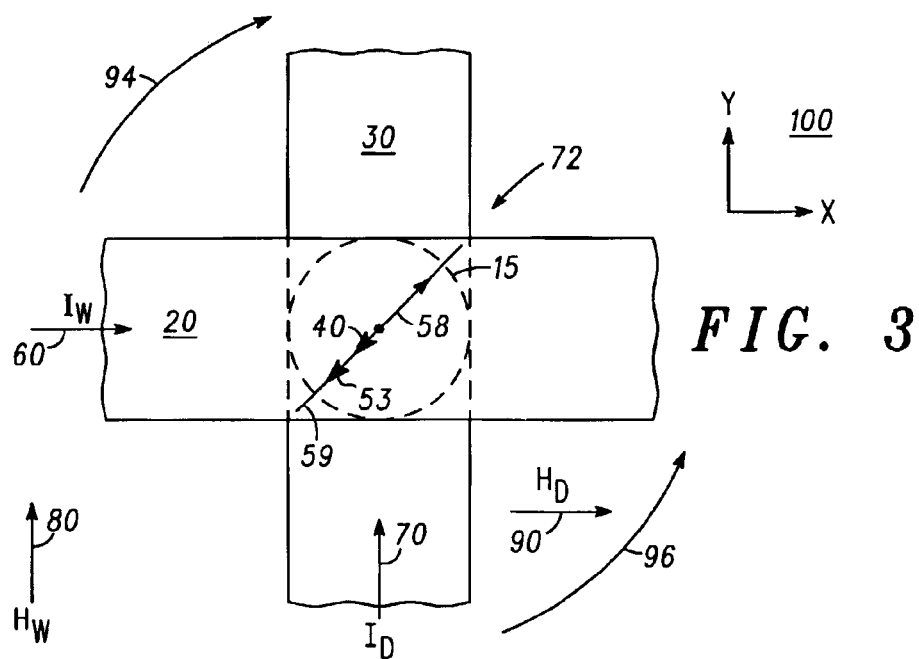
FIG. 3 is a simplified plan view of part of the MRAM device described with reference to FIG. 2, showing word and digit lines.

Referring to FIG. 3, a simplified plan view of parts of the MRAM array 5 is shown, in accordance with embodiments of the present invention. Bit magnetic region 15 is shown as having an essentially circular shape in the MRAM device 72 of FIG. 2, but may alternatively have another shape, such as an ellipse, that has an aspect ratio substantially greater than 1. Bit magnetic moment 40 is oriented along an anisotropic bit easy axis 59 in a direction that is essentially 45 degrees to a writing conductor that is, in this example, the word line 20. Another writing conductor, the data line 30, is orthogonal to the word line 20. To simplify the description of MRAM device 72, all directions will be referenced to an x-and y-coordinate system 100 as shown and to a clockwise rotation direction 94 and a counter-clockwise rotation direction 96. In MRAM array 5, a word current 60 is defined as being positive if flowing in a positive x-direction and a digit current 70 is defined as being positive if flowing in a positive y-direction. The purpose of word line 20 and digit line 30 is to create an applied magnetic field within MRAM device 10. A positive word current 60 will induce a circumferential word magnetic field, $H_W$ 80, and a positive digit current 70 will induce a circumferential digit magnetic field, $H_D$ 90. Since word line 20 is above MRAM device 10, in the plane of the element, $H_W$ 80 will be applied to MRAM device 10 in the positive y-direction for a positive word current 60. Similarly, since digit line 30 is below MRAM device 10, in the plane of the element, $H_D$ 90 will be applied to MRAM device 10 in the positive x-direction for a positive digit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

To illustrate how the writing methods for the MRAM array 5 work, it is assumed that a preferred anisotropy axis for magnetic moments 53 and 58 is directed at a 45° angle relative to the negative x-and negative y-directions and at a 450 angle relative to the positive x-and positive y-directions. As an example, FIG. 2 shows that magnetic moment 53 is directed at a 45° angle relative to the negative x-and negative y-directions. Since magnetic moment 58 is generally oriented anti-parallel to magnetic moment 53, it is directed at a 45° angle relative to the positive x-and positive y-directions. This initial orientation will be used to show examples of the writing methods, as will be discussed presently.

Figure 4:
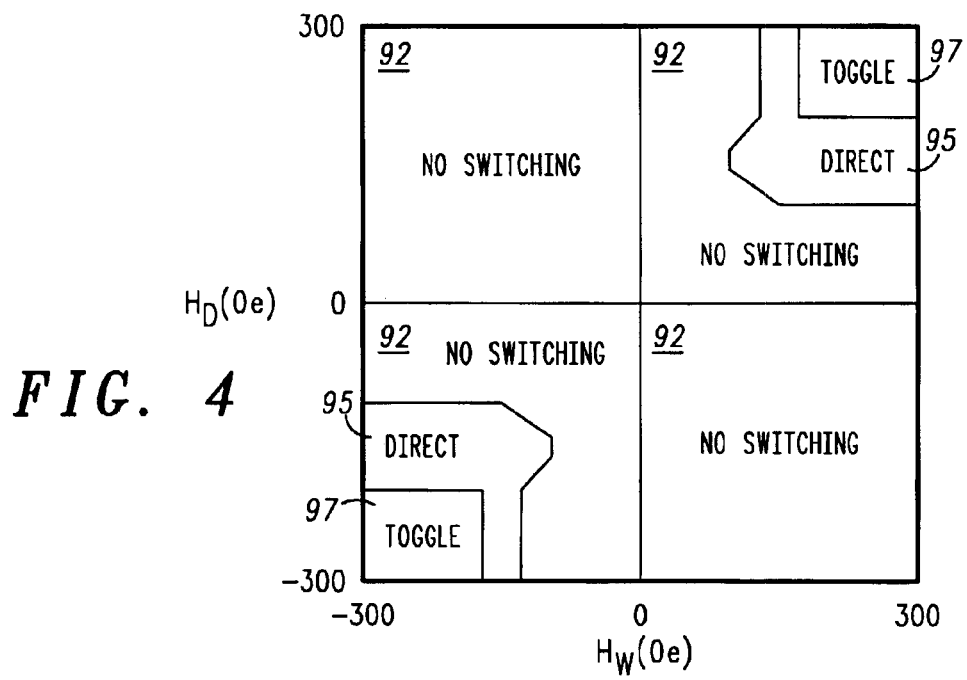
FIG. 4 is a graph showing results of a simulation of the magnetic field amplitude combinations that produce the direct or toggle write mode in the MRAM device described with reference to FIG. 2.
Figure 5:
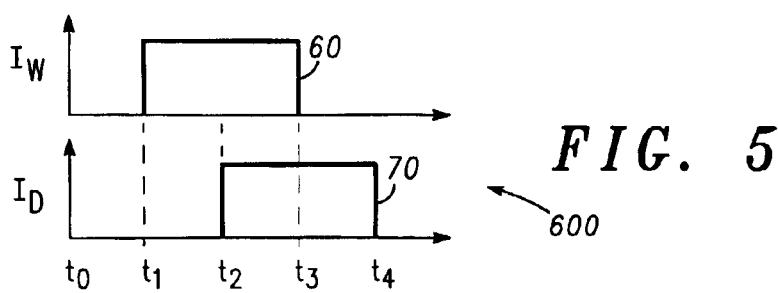
FIG. 5 is a timing graph showing the word current and the digit current of the MRAM device described with reference to FIG. 2.

Referring to FIG. 4, a graph shows results of a simulated switching behavior of the SAF tri-layer structure of bit magnetic region 15. The simulation uses two single domain magnetic layers that have close to the same moment (a nearly balanced SAF) with an intrinsic anisotropy, are coupled antiferromagnetically, and whose magnetization dynamics are described by the well known Landau-Lifshitz equation. The x-axis is the word line magnetic field amplitude in Oersteds, and the y-axis is the digit line magnetic field amplitude in Oersteds. The magnetic fields are applied in a pulse sequence 600 as shown in a timing graph in FIG.

5. The pulse sequence 600 includes word current 60 and digit current 70 as functions of time.

There are three magnetic field regions of operation illustrated in FIG. 4. In a magnetic field region 92 there is no switching. For MRAM operation in a magnetic field region 95, a direct writing method is in effect. When using the direct writing method, there is no need to determine the initial state of the MRAM device because the state is only switched if the state being written is different from the state that is stored. The selection of the written state is determined by the direction of current in both word line 20 and digit line 30. For example, if a '1' is to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1 or '0' with the appropriate polarity of current pulses, regardless of its initial state. Throughout this disclosure, operation in magnetic field region 95 will be defined-as "direct write mode".

For MRAM operation in a magnetic field region 97, a toggle writing method is in effect. When using the toggle writing method, there is a need to determine the initial state of the MRAM device before writing because the state is switched every time the MRAM device is written to, regardless of the direction of the currents as long as the same polarity current pulses are chosen for both word line 20 and digit line 30. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 72 must first be read and compared to the state to be written. The reading and comparing may require additional logic circuitry, including a buffer for storing information and a comparator for comparing memory states. MRAM device 72 is then written to only if the stored state and the state to be written are different. One of the advantages of this method is that the power consumed is lowered because only the differing bits are switched. An additional advantage of using the toggle writing method is that only uni-polar voltages are required and, consequently, smaller transistors can be used to drive the MRAM device. Throughout this disclosure, operation in magnetic field region 97 will be defined as "toggle write mode".

Both writing methods involve supplying currents in word line 20 and digit line 30 such that magnetic moments 53 and 58 can be oriented in one of two preferred directions as discussed previously. To fully elucidate the two switching modes, specific examples describing the time evolution of magnetic moments 53, 58, and 40 are now given.

Figure 6:
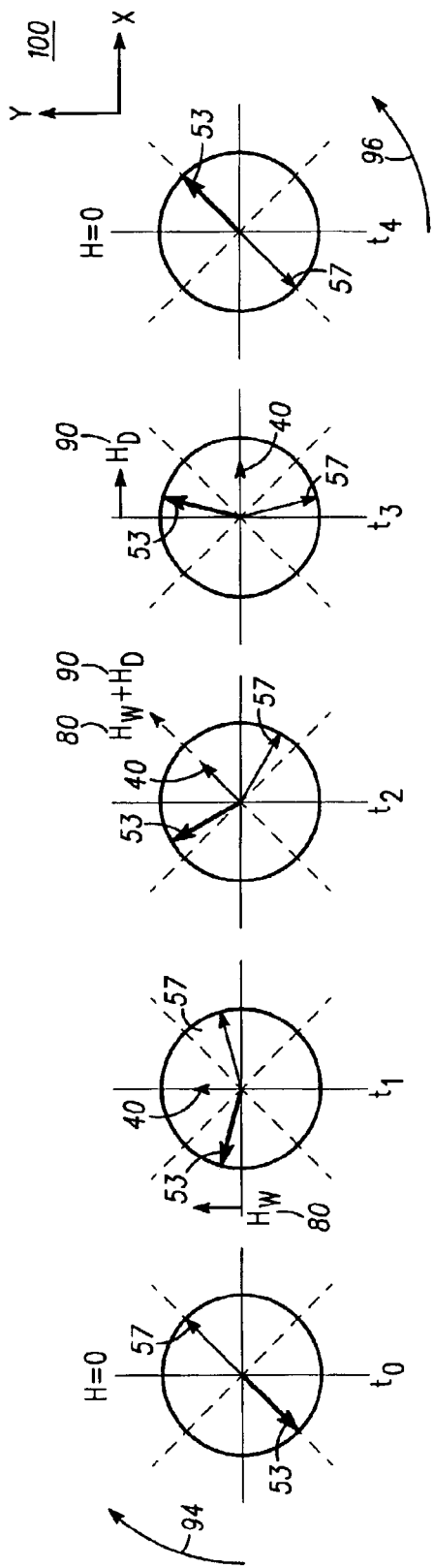
FIG. 6 is a vector diagram showing the rotation of the magnetic moments for a magnetoresistive random access memory device for the toggle write mode when writing a '1' to a '0 in the MRAM device described with reference to FIG. 2.

Referring to FIG. 6, a vector diagram shows the toggle write mode for writing a '1' to a '0' using pulse sequence 600 in MRAM device 72. In this illustration at time to, magnetic moments 53 and 58 are oriented in the preferred directions as shown in FIG. 2. This orientation will be defined as a '1'.

At a time $t_1$, a positive word current 60 is turned on, which induces $H_W$ 80 to be directed in the positive y-direction. The effect of positive $H_W$ 80 is to cause the nearly balanced anti-aligned MRAM tri-layer to "flop" and become oriented approximately 90° to the applied field direction. The finite antiferromagnetic exchange interaction between ferromagnetic layers 45 and 55 will allow magnetic moments 53 and 58 to now deflect at a small angle toward the magnetic field direction and net magnetic moment 40 will subtend the angle between magnetic moments 53 and 58 and will align with $H_W$ 80. Hence, magnetic moment 53 is rotated in clockwise direction 94. Since net magnetic moment 40 is the vector addition of magnetic moments 53 and 58, magnetic moment 58 is also rotated in clockwise direction 94.

At a time $t_2$, positive digit current 70 is turned on, which induces positive $H_D$ 90. Consequently, net magnetic moment 40 is being simultaneously directed in the positive y-direction by $H_W$ 80 and the positive x-direction by $H_D$ 90, which has the effect of causing net magnetic moment 40 to further rotate in clockwise direction 94 until it is generally oriented at a 45° angle between the positive x-and positive y-directions. Consequently, magnetic moments 53 and 58 will also further rotate in clockwise direction 94.

At a time $t_3$, word current 60 is turned off so that now only $H_D$ 90 is directing net magnetic moment 40, which will now be oriented in the positive x-direction. Both magnetic moments 53 and 58 will now generally be directed at angles passed their anisotropy hard-axis instability points.

At a time $t_4$, digit current 70 is turned off so a magnetic field force is not acting upon net magnetic moment 40. Consequently, magnetic moments 53 and 58 will become oriented in their nearest preferred directions to minimize the anisotropy energy. In this case, the preferred direction for magnetic moment 53 is at a 45° angle relative to the positive y-and positive x-directions. This preferred direction is also 180° from the initial direction of magnetic moment 53 at time to and is defined as '0'. Hence, MRAM device 72 has been switched to a '0'. It will be understood that MRAM device 72 could also be switched by rotating magnetic moments 53, 58, and 40 in counter clockwise direction 96 by using negative currents in both word line 20 and digit line 30, but is shown otherwise for illustrative purposes.

Figure 7:
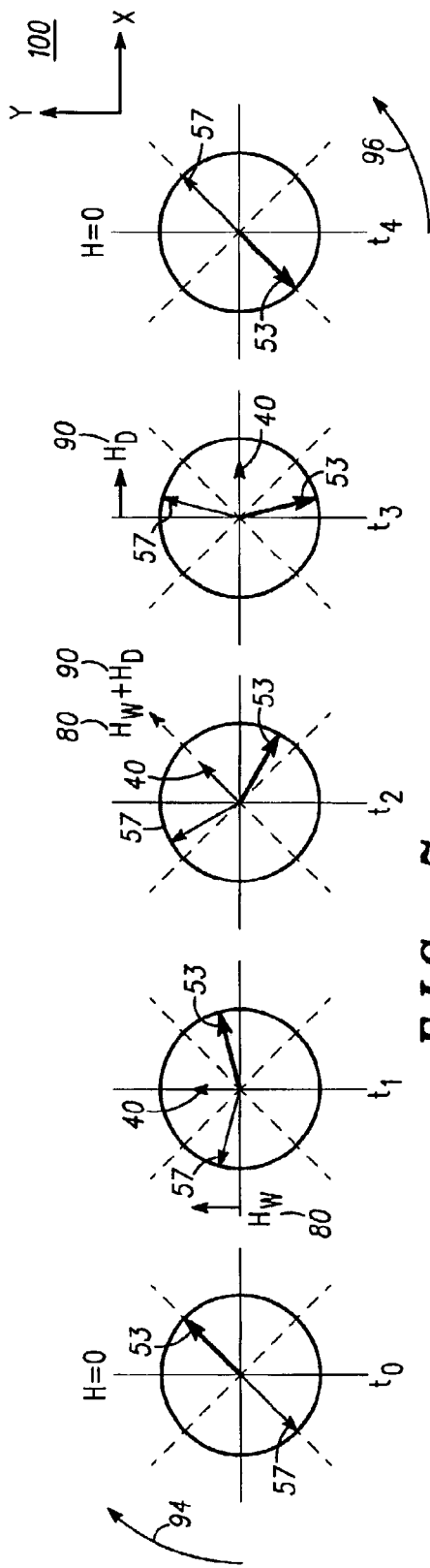
FIG. 7 is a vector diagram showing the rotation of the magnetic moments for a magnetoresistive random access memory device for the toggle write mode when writing a '0' to a '1' in the MRAM device described with reference to FIG. 2.

Referring to FIG. 7, a vector diagram shows the toggle write mode for writing a '0' to a '1' using pulse sequence 600 in MRAM device 72. Illustrated are the magnetic moments 53 and 58, as well as net magnetic moment 40, at each of the times $t_0$, $t_1$, $t_2$, $t_3$, and $t_4$ as described previously showing the ability to switch the state of MRAM device 10 from '0' to 1' with the same current and magnetic field directions. Hence, the state of MRAM device 72 is written to with toggle write mode, which corresponds to magnetic field region 97 in FIG. 4.

For the direct write mode, it is assumed that magnetic moment 53 is larger in magnitude than magnetic moment 58, so that magnetic moment 40 points in the same direction as magnetic moment 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 8:
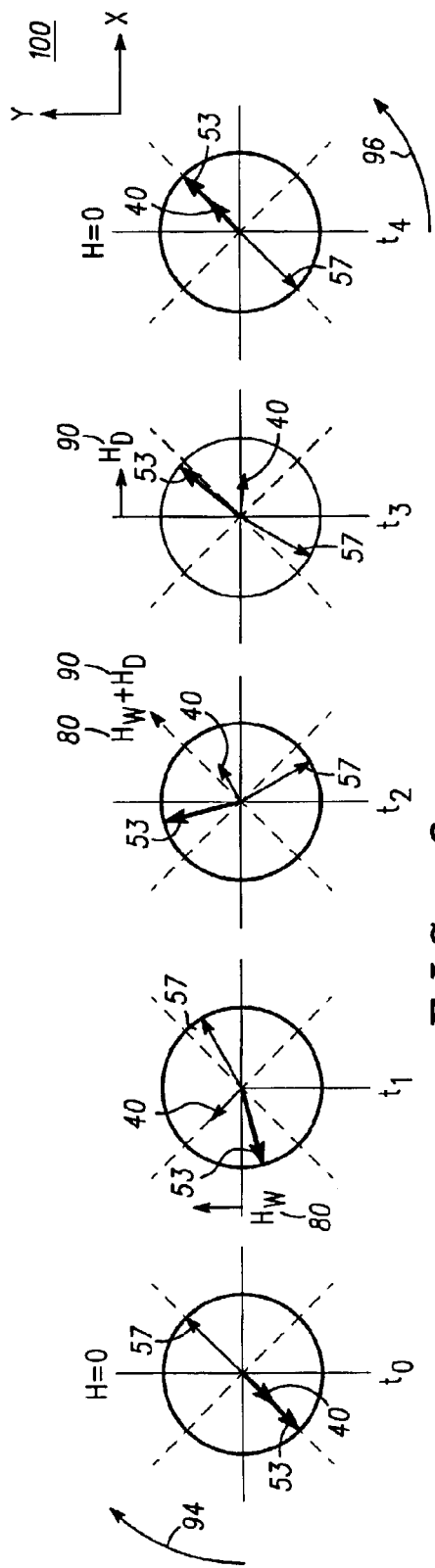
FIG. 8 is a vector diagram showing the rotation of the magnetic moments for a magnetoresistive random access memory device for the direct write mode when writing a '1' to a '0' in the MRAM device described with reference to FIG. 2.

Referring to FIG. 8, a vector diagram shows an example of writing a '1' to a '0', using the direct write mode using pulse sequence 600 in MRAM device 72. Here again, the memory state is initially a '1' with magnetic moment 53 directed 45° with respect to the negative x-and negative y-directions and magnetic moment 58 directed 45° with respect to the positive x-and positive y-directions. Following the pulse sequence as described above with positive word current 60 and positive digit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with net magnetic moment 40 oriented at a 45° angle in the positive x-and positive y-directions as desired. Similar results are obtained when writing a '0' to a '1' only now with negative word current 60 and negative digit current 70.

Figure 9:
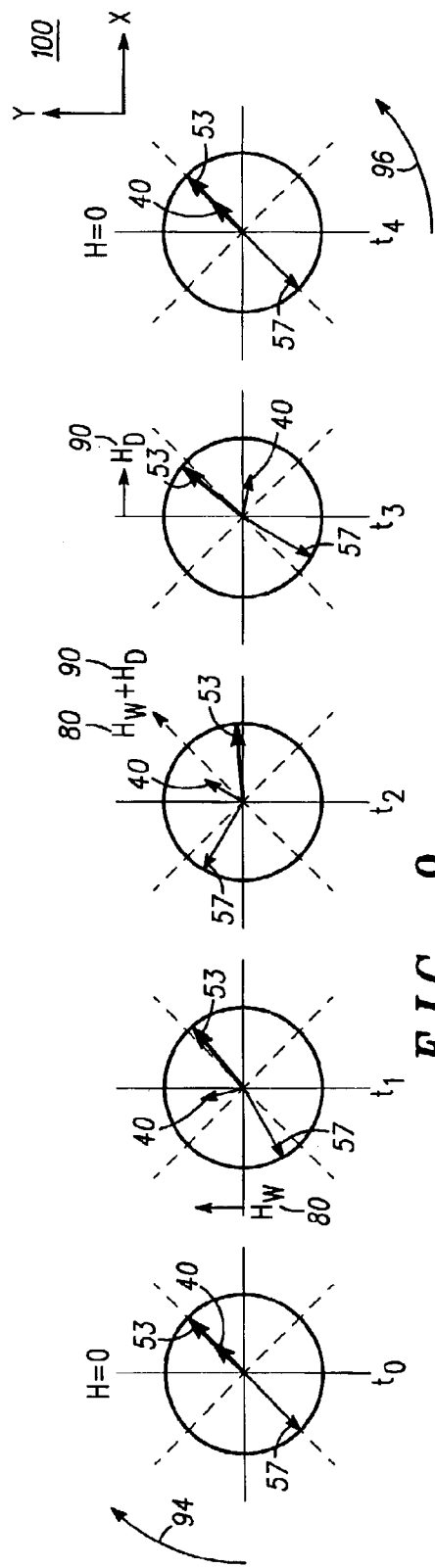
FIG. 9 is a vector diagram showing the rotation of the magnetic moments for a magnetoresistive random access memory device for the direct write mode when writing a '0' to a state that is already a '0' in the MRAM device described with reference to FIG. 2.

Referring to FIG. 9, a vector diagram shows the magnetic moments rotations in MRAM device 72 for an example of writing using the direct write mode when the new state is the same as the state already stored. In this example, a '0' is already stored in MRAM device 72 and current pulse sequence 600 is now repeated to store a '0'. Magnetic moments 53 and 58 attempt to "flop" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 58 crosses the x-axis and the system stabilizes with the dominant moment 53 returned to near its original direction. Therefore, at a time $t_4$ when the magnetic field is removed, and the state stored in MRAM device 72 will remain a '0'. This sequence illustrates the mechanism of the direct write mode shown as magnetic field region 95 in FIG. 4. Hence, in this convention, to write a '0' requires positive current in both word line 20 and digit line 30 and, conversely, to write a '1' negative current is required in both word line 20 and digit line 30.

If larger fields are applied, eventually the energy decrease associated with a flop exceeds the additional energy barrier created by the dipole energy of the unbalanced moment which is preventing a toggle event. At this point, a toggle event will occur and the switching is described by magnetic field region 97.

Magnetic field region 95, in which the direct write mode applies, can be expanded, i.e. toggle mode magnetic field region 97 can be moved to higher magnetic fields, if the times $t_3$ and $t_4$ are equal or made as close to equal as possible. In this case, the magnetic field direction starts at 45° relative to the bit anisotropy axis when word current 60 turns on and then moves to parallel with the bit anisotropy axis when digit current 70 turns on. This example is similar to the typical magnetic field application sequence. However, now word current 60 and digit current 70 turn off substantially simultaneously, so that the magnetic field direction does not rotate any further. Therefore, the applied field must be large enough so that the net magnetic moment 40 has already moved past its hard-axis instability point with both word current 60 and digit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 10:
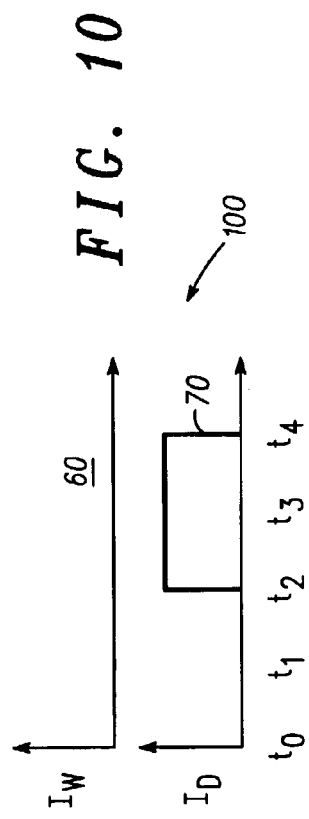
FIG. 10 is a timing graph of the word current and the digit current when only the digit current is turned on in the MRAM device described with reference to FIG. 2.
Figure 11:
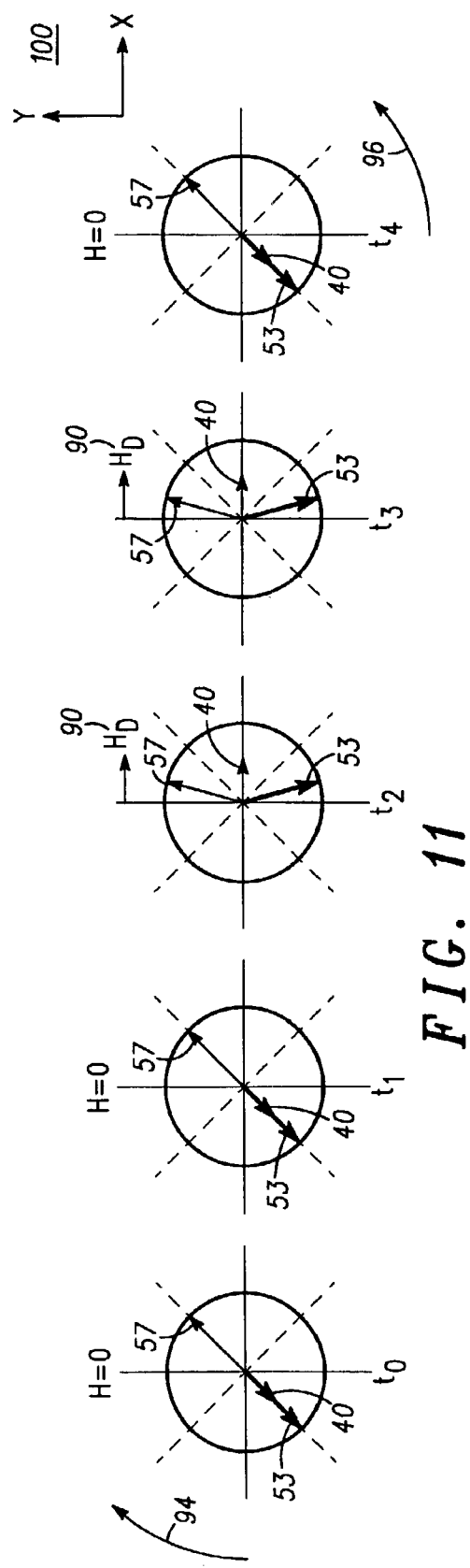
FIG. 11 is a vector diagram showing the rotation of the magnetic moments for a magnetoresistive random access memory device when only the digit current is turned on in the MRAM device described with reference to FIG. 2.
Figure 12:
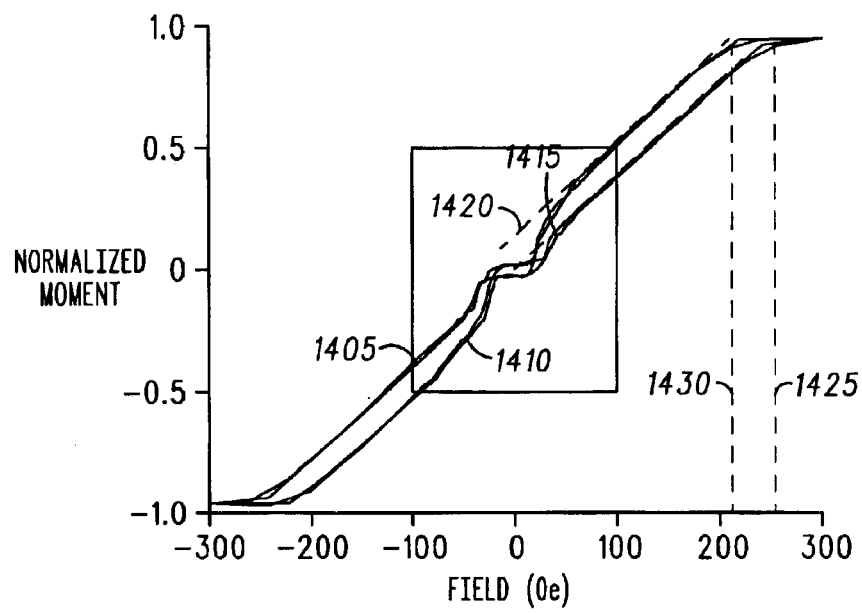
FIG. 12 is a graph that shows plots of a normalized magnetic moment versus an applied field for two samples of nearly balanced synthetic antiferromagnetic structures.
Figure 13:
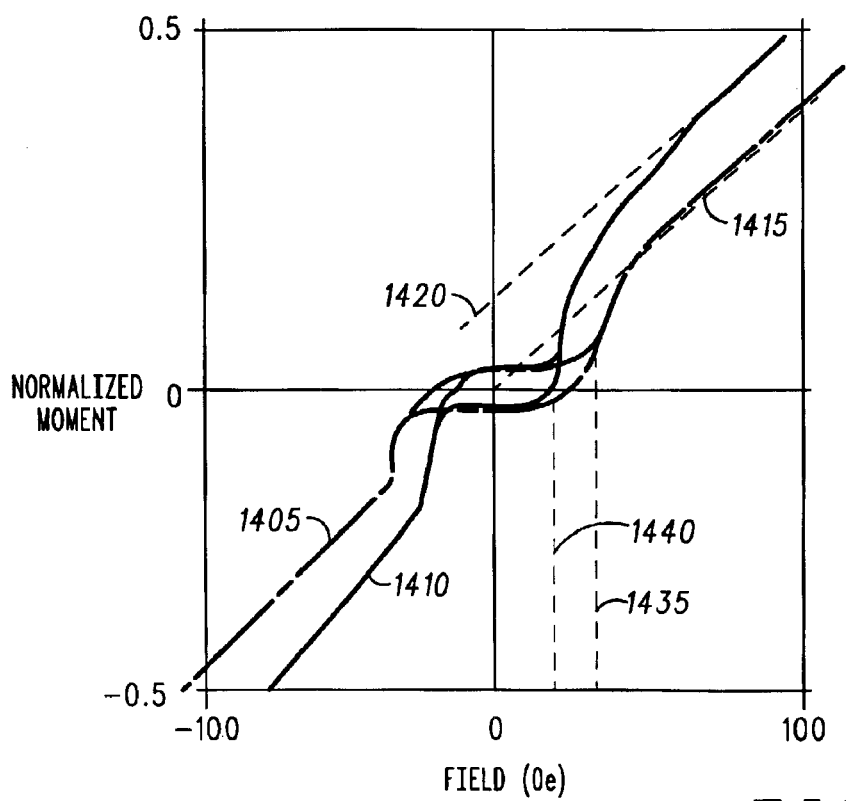
FIG. 13 is an enlarged view of the center portion of FIG. 12.

The writing methods described with reference to FIGS. 4–13, herein called the Savtchenko writing technique, are highly selective because only the MRAM device that has both word current 60 and digit current 70 turned on between time $t_2$ and time $t_3$ will switch states. This feature is illustrated in FIGS. 12 and 13. FIG. 10 is a timing graph that shows a pulse sequence 600 used in MRAM device 72 when word current 60 is not turned on and digit current 70 is turned on. FIG. 11 is a vector diagram that shows the corresponding behavior of the state of MRAM device 72. At a time $t_0$, magnetic moments 53 and 58, as well as net magnetic moment 40, are oriented as described in FIG. 3. In pulse sequence 600, digit current 70 is turned on at a time $t_1$. During this time, $H_D$ 90 will cause net magnetic moment 40 to be directed in the positive x-direction.

Since word current 60 is never switched on, magnetic moments 53 and 58 are never rotated through their anisotropy hard-axis instability points. As a result, magnetic moments 53 and 58 will reorient themselves in the nearest preferred direction when digit current 70 is turned off at a time $t_3$, which in this case is the initial direction at time $t_0$. Hence, the state of MRAM device 72 is not switched. It will be understood that the same result will occur if word current 60 is turned on at similar times described above and digit current 70 is not turned on. Furthermore, it will be understood that even if both the word current 60 and the digit current 70 are both turned on simultaneously, with non-varying magnitudes, the same result will occur. This feature ensures that only one MRAM device in an array will be switched, while the other devices will remain in their initial states. As a result, unintentional switching is avoided and the bit error rate is minimized. Thus, in an approach analogous to that used for the MRAM device 71 described with reference to FIGS. 2 and 3, there is a region of values for the applied magnetic field within which there is assurance that the bit magnetic moment will not be rotated from one stable polarity to another in the bit easy axis 59. This region of values corresponds to the magnetic field region 92 described with reference to FIG. 4, although it will be appreciated that the size of the non-switching magnetic field region for an MRAM being commercially distributed will be slightly smaller than the illustrated size of the magnetic field region as simulated for one device, to account for manufacturing variations.

One vital performance characteristic of the MRAM device 72 is the power used to write information into it, and the power is directly related to the field strength required for switching (also called herein the "flop field"). It will be appreciated that the strength of an applied magnetic field required for causing the magnetic material of a nearly balanced SAF to flop is determined by the anisotropy of the SAF structure (bit magnetic region 15) and the saturation field of the SAF structure (not shown in FIG. 4.) These parameters are, in turn, the result of engineering decisions that are made during the design of the MRAM device 72 to optimize many aspects of the MRAM fabrication and performance. For a particular relationship of field components (such as $H_W=H_D$), the flop field required to effect a flop of the magnetic moment is conventionally modeled by $H_{flop}=$ sqrt($H_k * H_{sat}$) where $H_{flop}$ is the field strength required for switching in the toggle mode, $H_k$ is the anisotropy, and $H_{sat}$ is the SAF saturation field of the structure. However, in accordance with the preferred embodiment of the present invention, small regions dispersed within the MRAM device 72 formed during fabrication of the MRAM device 72, called herein "weakly coupled regions" (WCR), overcome the antiferromagnetic coupling present in the rest of the sample, saturate, and become ferromagnetically aligned, in fields much less than $H_{sat}$. These regions cause a reduction of $H_{flop}$ by an amount measured in some experiments to be approximately 50% of that given by the above formula. It will be appreciated that this reduction reduces the power consumption of an MRAM array considerably and is therefore a very desirable benefit. In addition to having a measurably reduced flop field (when compared to the conventional model), the WCR are characterized by an extrapolated magnetic remanence that is not present in nearly balanced SAF structures that are not formed as described herein below.

Referring to FIG. 12, a graph shows plots of a normalized magnetic moment versus a field applied along the magnetic easy axis for two samples of nearly balanced synthetic antiferromagnetic structures; one sample fabricated in a conventional manner, herein known as the conventional SAF, and the other fabricated in accordance with the preferred embodiments of the present invention. These are bulk samples wherein the SAF is constructed of ferromagnetic layers of NiFe and an antiferromagnetic exchange coupling material of Ru. The anisotropy for this structure is 5 Oe. Plot 1405 is the plot of the normalized magnetic moment versus an applied field for the sample fabricated in a conventional manner. The low field behavior of plot 1405 is better viewed in FIG. 13, which is an enlarged view of the center portion of FIG. 12. It can be seen that as the field is increased from zero field, initially, there is no change in the moment. This corresponds to no change in the magnetization state for the sample over this field range. When the field reaches 1435, a value of the field for this case of roughly 35 Oe, there is a sudden change in the net moment from the sample. This corresponds to the SAF flop mentioned previously and the value of the field at this point, $H_{flop\ 1}$, is called the flop field. The moments of the two layers are substantially anti-parallel but now oriented 90 degrees to the applied field direction. As the applied field increases further there is a linear region which corresponds to the angle between the moments of the two layers reducing as each moment points more and more in the direction of the applied field. When the applied field reaches a value of applied field, 1425, both moments are pointing in the direction of the applied field and the sample moment is saturated. This value is approximately 255 Oe for this sample. It can be appreciated that these values for Hk (5 Oe), Hsat (255 Oe), and the flop field, $H_{flop\ 1}$, (35 Oe) provide good agreement with the model mentioned above; 35 is approximately equal to sqrt(5*255). Also shown in FIGS. 12 and 13 is an extrapolation of the linear response of moment with field back to zero field 1415. For a conventional SAF 1405, the value of the extrapolation at zero field is zero.

Plot 1410, shown in FIGS. 12 and 13, is the plot of normalized moment versus an applied field for the SAF sample fabricated in accordance with the preferred embodiments of the present invention. It is the same sample mentioned above after annealing. Referring now to FIG. 13, it can be seen that plot 1410 has similar behavior in the low field portion of the plot where the applied field is near zero. The zero field behavior of the SAF structure fabricated in accordance with the preferred embodiments of the present invention is identical to that of a SAF fabricated in the conventional manner; at zero field the sample is completely antiferromagnetically coupled. Since reading is performed in zero field, it is highly advantageous to have the zero field behavior of the SAF structure fabricated in accordance with the preferred embodiments of the present invention be identical to that of a SAF fabricated in the conventional manner. However, it will be appreciated that the value (strength) 1440 of the applied magnetic field at which the flop of the magnetic moment occurs, $H_{flop\ 2}$, is nearly one-half (approximately 18 Oersteds) of the flop field 1435 (approximately 35 Oersteds), $H_{flop\ 1}$, for the conventionally fabricated SAF sample. Furthermore, for this SAF sample fabricated in accordance with the preferred embodiment of the present invention, the plot 1410 shows that the magnetic moment reaches saturation at an applied field strength 1430, $H_{sat2}$, of about 208 Oersteds. Unlike the conventional SAF mentioned above, there is no agreement between these values Hk (5 Oe), Hsat (208 Oe), and the flop field, $H_{flop\ 1}$, (18 Oe); 18 does not equal sqrt(5*208). The flop field for the sample fabricated in accordance with the preferred embodiment of the present invention reduces the flop field below a SAF with a similar anisotropy and SAF saturation therefore reducing the power used to write information.

Also shown in FIGS. 12 and 13, is an extrapolation 1420 of a linear portion of plot 1410, to approximately 0.12 along the vertical, normalized moment axis when the applied field is zero. This intersection is called herein the extrapolated remanence. The WCR give rise to the extrapolated remanence exhibited by the sample of nearly balanced (SAF) structure fabricated in accordance with the preferred embodiments of the present invention. Not being bound by theory, it is believed that these weakly coupled regions of the SAF maintain antiparallel alignment between the ferromagnetic layers at zero field thus behaving in a similar fashion to a conventional SAF. This is most likely due to the exchange coupling between these regions and the surrounding ferromagnetic material that still is experiencing a strong antiparallel coupling. However at a field lower than the conventional flop field the WCR saturate becoming ferromagnetically aligned. This is evidenced by the larger increase in moment after the flop transition for the SAF with WCR than without. This field at which these WCR saturate corresponds with reduced flop field for the SAF. It is believed that the magnetization change in these WCR induces the reduced flop for the entire sample. The saturation of the WCR is deduced from the identical linear relationship between moment and applied field for the remaining hysteresis loop between the SAF with and without the WCR. By this theory, the WCR add moment until the flop is complete (saturate) and subsequently the remaining regions of the sample that are still antiferromagnetically coupled exhibit a similar response to field through to saturation. Extrapolating this linear region back to zero field provides a way to quantify the amount in moment of the sample that is contained within these WCR and defines the extrapolated remanence mentioned above. For this sample these regions form approximately 12% of the total area. A conventional SAF will have an extrapolated remanence of zero since such a SAF does not possess any of these easily saturated WCR. Evidence from X-ray diffraction supports the ideas that these regions are not the result of a significant structural failure of the structure, but rather a thin point at which the weakened coupling between the two ferromagnetic layers can develop. The similar behavior of the linear region after the flop when comparing a SAF with the WCR to one without the WCR also supports the idea that there is not a significant change in the majority of the sample; it behaves the same, and supports the theory that the difference resides in the added moment during the flop. An upper boundary for the percentage of the area of the sample that these regions can form without providing significant real remanence in a SAF, based on the experiments, is approximately 20 percent. If the SAF structure were to be annealed at temperatures higher than those used in accordance with one embodiment of the present invention, these regions would grow and remain ferromagnetically coupled even at zero field. With such high temperature annealing, physical bridges form between the ferromagnetic layers, overwhelming the antiparallel coupling in the regions surrounding the contact point and causing real (non-extrapolated) remanence.

Figure 14:
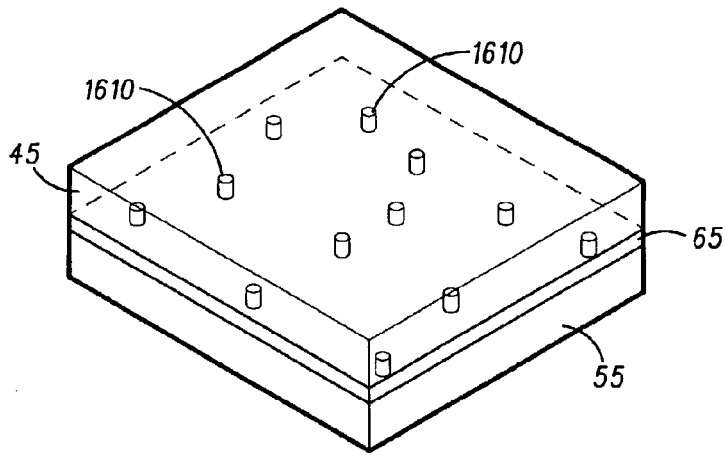
FIG. 14 is a perspective drawing of a portion of a synthetic antiferromagnetic structure fabricated in accordance with the present invention.

Referring to FIG. 14, a perspective drawing of a portion of the SAF structure 15 is shown after it has been fabricated in accordance with the present invention. As mentioned above, the dispersed regions 1610 are called herein weakly coupled regions (WCR). A SAF structure exhibiting any non-zero extrapolated remanence is a SAF having WCR that has been formed in accordance with the present invention. Furthermore, a SAF exhibiting a flop field significantly reduced from the value predicted from the model presented above is a SAF having WCR that has been formed in accordance with the present invention.

The dispersed regions 1610 are formed, in accordance with the preferred embodiment of the present invention, by annealing a nearly balanced SAF structure that has been fabricated using conventional deposition techniques, with the ferromagnetic layers and the antiparallel coupling layer having essentially uniform (but not necessarily equal) thicknesses. This process does not significantly alter the nominal thicknesses of the layers 45, 55, 65 of the nearly balanced SAF. The annealing is performed at a temperature and for a duration that is experimentally determined, for a particular set of materials and size parameters of a SAF structure, to optimize the benefits of the WCR by reducing the flop field, while avoiding permanent remanence.

In accordance with another embodiment of the present invention, a method for forming the WCR is to fabricate the antiparallel coupling layer as a plurality of layers. The layers may be of differing materials and may include one or both of antiferromagnetic exchange coupling materials and spacing materials, as described above. The layers are deposited in a manner experimentally determined to optimize the benefits of the WCR by reducing the flop field while avoiding permanent remanence.

In accordance with another embodiment of the present invention, a very thin uniform layer of antiferromagnetic exchange coupling material can be deposited, followed by another layer of antiferromagnetic exchange coupling material that is deposited using a material that is selected for and deposited in a manner that induces thickness variations that are experimentally determined to achieve the optimized results. The material and deposition parameters are chosen to optimize the desired results.

In accordance with another embodiment of the present invention, the WCR are formed by co-depositing a spacer material with the antiferromagnetic exchange material such that regions of reduced coupling are dispersed throughout the sample. This spacer material could be immiscible to the exchange layer used, so as to provide larger regions of reduced coupling dispersed throughout the sample. The material and deposition parameters are chosen to optimize the desired results.

In accordance with yet another embodiment of the present invention, a method for forming the WCR is by depositing a first ferromagnetic layer, then roughening the surface of the ferromagnetic layer, using any well known technique for doing so—for example, by etching or abrading the layer; then depositing the antiparallel coupling layer followed by a second ferromagnetic layer. The first ferromagnetic layer may also be treated so as to induce a three dimensional island-like growth in the antiferromagnetic coupling layer.

Memory systems 450, 550 as described herein can be included in complicated systems-on-a-chip that include, for example an essentially complete cellular radio, or in microprocessors that are used in a very wide variety of electronic devices, including consumer products ranging from portable music players to automobiles; military products such as communication radios and communication control systems; and commercial equipment ranging from extremely complicated computers to robots to simple pieces of test equipment, just to name some types and classes of electronic equipment.

Figure 15:
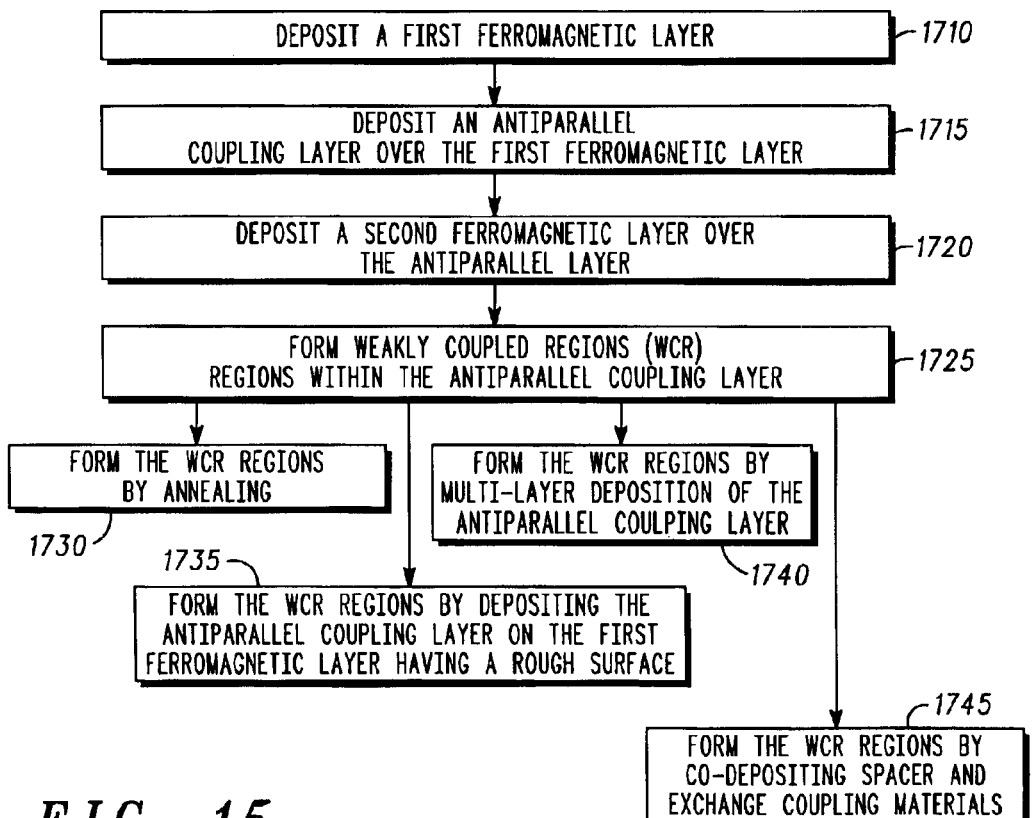
FIG. 15 is a flow chart of a process for fabricating a magnetoresistive tunneling junction memory cell in accordance with an exemplary embodiment of the present invention.

Referring now to FIG. 15, a flow chart shows some steps of a process for fabricating an SAF structure that can be used in a magnetoresistive tunneling junction memory cell, using the techniques described in this disclosure. Some steps that have been described herein above and some steps that are obvious to one of ordinary skill in the art are not shown in the flow chart, but would be used to fabricate the SAF structure. At step 1710, a first ferromagnetic layer 55 (FIG. 2) is deposited on a substrate, such as a substrate for a plurality of integrated circuits that each include an array of magnetoresistive tunneling junction memory cells that are accessed for reading and writing by an electronically addressable matrix of conductors, or a substrate for a memory that is accessed for reading and writing by a moving read/write head, such as a disk drive. The substrate may have had patterned layers formed on it before step 1710. At step 1715, an antiparallel coupling layer 65 (FIG. 2) is deposited over the first ferromagnetic layer. A second ferromagnetic layer 45 (FIG. 2) is deposited, at step 1720, over the antiparallel coupling layer 65, and at step 1725 WCR 1610 (FIG. 14) are formed in the antiferromagnetic exchange coupling layer. The WCR 1610 are formed by annealing, as shown in step 1730, or by depositing the antiparallel coupling layer on the first ferromagnetic layer, which has been fabricated to have a rough surface, as shown in step 1735, or by a multi-layer deposition of the antiparallel coupling layer on the first ferromagnetic layer, as shown in step 1740, or by forming the antiparallel coupling layer as an alloy of a spacer material and an exchange coupling material, for example, by co-depositing the spacer and exchange coupling materials on the first ferromagnetic layer, as shown in step 1745. Forming the WCR by annealing can occur at any point after the layers are deposited. The WCR can also be formed by using combinations of the methods described with reference to steps The SAF of the magnetoresistive tunneling junction memory cell can be characterized in several ways that include characterization by a value of a flop field that is significantly below the square root of the product of an anisotropy and SAF saturation of the structure, as shown in block 1830, or characterization by a normalized extrapolated remanence that is greater than zero, as shown in block 1835.

It will be appreciated that the unique SAF structure described herein is advantageous in memory cells with which the Savtchenko writing technique is used (memory cells of either the tunneling type or non-tunneling type), and the SAF structure described herein may be useful in other magnetoelectronic devices as well, wherein low switching fields are important.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A magnetoelectronic memory device that comprises:
   a nearly balanced synthetic antiferromagnetic (SAF) structure, comprising
   two ferromagnetic layers; and
   an antiparallel coupling layer separating the two ferromagnetic layers and having weakly coupled regions (WCR) therein; and
   a means for inducing an applied magnetic field in the nearly balanced SAF.

2. A magnetoelectronic memory device that comprises:
   a nearly balanced synthetic antiferromagnetic (SAF) structure comprised of a bit magnetic region having a bit magnetic moment that has a polarity in a bit easy axis when there is no applied magnetic field, comprising:
   two ferromagnetic layers, and
   an antiparallel coupling layer separating the two ferromagnetic layers and having weakly coupled regions (WCR) therein;
   a means for inducing an implied magnetic field in the nearly balanced SAF;
   an electrically insulating material designed to form a magnetoresistive tunneling barrier, wherein the bit magnetic region is positioned on one side of the electrically insulating material; and
   a reference magnetic region positioned on an opposite side of the electrically insulating material, wherein the electrically insulating material and the bit and reference magnetic regions form a magnetoresistive tunneling junction device (MTJD).

3. The magnetoelectronic memory device according to claim 2, wherein each of the two ferromagnetic layers comprises at least one of a group of elements consisting of Ni, Fe and Co, Mn.

4. The magnetoelectronic memory device according to claim 2, wherein the antiparallel coupling layer comprises at least one of a group of elements consisting of Ru, Os, Re, Cr, Rh, Cu, Nb, Mo, Ta, W, Ir, and V.

5. The magnetoelectronic memory device according to claim 2, wherein the WCR are formed by annealing.

6. The magnetorelectronic memory device according to claim 2, wherein the WCR are regions within which the two ferromagnetic layers are ferromagnetically coupled to each other.

7. A magnetoelectronic memory device that comprises:
   a nearly balanced synthetic antiferromagnetic (SAF) structure, comprising two ferromagnetic layers, and
   an antiparallel coupling layer separating the two ferromagnetic layers and having weakly coupled regions (WCR) therein, and wherein the antiparallel coupling layer comprises one of an insulator and a conductor, and
   a means for inducing an implied magnetic field in the nearly balanced SAF.

8. A magnetoelectronic memory device according to claim 7, wherein the nearly balanced SAF structure has an aspect ratio in a range from 1 to 5.

9. The magnetoelectronic memory device according to claim 7, wherein the two ferromagnetic layers have thickness in a range from 5 to 150 angstroms.

10. A magnetoelectronic memory device that comprises:
    a nearly balanced synthetic antiferromagnetic (SAF) structure, comprising
    two ferromagnetic layers having a moment difference not greater than 15 percent, and
    an antiparallel coupling layer separating the two ferromagnetic layers and having weakly coupled regions (WCR) therein; and
    a means for inducing an applied magnetic field in a nearly balanced SAF.

11. A magnetoelectronic memory device that comprises:
    a nearly balanced synthetic antiferromagnetic (SAF) structure comprising two ferromagnetic layers, and
    an antiparallel coupling layer separating the two ferromagnetic layers and having weakly coupled regions (WCR) therein; and
    a means for inducing an applied magnetic field in the nearly balanced SAF wherein the antiparallel coupling layer has nominal thickness in a range from 3 to 30 Angstroms.

12. The magnetoelectronic memory device according to claim 11, wherein the nearly balanced SAF structure comprises N ferromagnetic layers (including the two ferromagnetic layers) separated from each other by antiparallel coupling layers, where N Is a whole number greater than or equal to two.

13. The magnetoelectronic memory device according to claim 12, wherein at least one of the antiparallel coupling layers comprises at least one of a group of elements consisting of Ru, Os, Re, Cr, Rh, Cu, Nb, Mo, Ta, W, Ir, and V.

14. The magnetoelectronic memory device according to claim 12, wherein at least one of the antiparallel coupling layers comprises one of an insulator and a conductor.

15. The magnetoelectronic memory device according to claim 12, wherein a net moment imbalance of the N ferromagnetic layers does not exceed 15%.

16. A magnetoelectronic memory device that comprises:
    a nearly balanced antiferromagnetic (SAF) structure, comprising
    two ferromagnetic layers, and
    an antiparallel coupling layer separating the two ferromagnetic layers and having weakly coupled regions (WCR) therein, wherein the WCR comprises an alloy of an exchange coupling material and a spacer material; and
    a means for inducing an applied magnetic field in the nearly balanced SAF.

17. A magnetoelectronic memory device that comprises:
    a nearly balanced synthetic antiferromagnetic (SAF) structure, comprising
    two ferromagnetic, and
    an antiparallel coupling layer separating the two ferromagnetic layers and having weakly coupled regions (WCR) therein, wherein the WCR are formed by multilayer deposition of the antiparallel coupling layer; and
    a means for inducing an applied magnetic field in the nearly balanced SAF.

18. The magnoelectronic memory device according to claim 17, wherein a normalized extrapolated remanence of the SAF structure is greater than zero.

19. A magnetoelectronic memory device that comprises:
a nearly balanced synthetic antiferromagnetic (SAF) structure, comprising
two ferromagnetic layers, and
an antiparallel coupling layer separating the two ferromagnetic layers and having weakly coupled regions (WCR) therein; and
a means for inducing an applied magnetic field in the nearly balanced SAF, wherein a value of a flop field is significantly below the square root of the anisotropy and a saturation of the SAF structure.

20. A magnetoelectronic device that comprises:
at least one write line; and
a nearly balanced synthetic antiferromagnetic (SAF) structure, comprising:
two ferromagnetic layers
an antiparallel coupling layers separating the two ferromagnetic layers and having weakly coupled regions (WCR) therein.

21. A magneto resistive memory cell that comprises:
a nearly balanced synthetic antiferromagnetic (SAF) structure, comprising:
two ferromagnetic layers
an antiparallel coupling layer separating the two ferromagnetic layers and having weakly coupled regions (WCR) therein; and
a means for inducing an applied magnetic field in the nearly balanced SAF structure.

22. A magnetoelectronic memory cell that comprises:
a nearly balanced synthetic antiferromagnetic (SAF) structure, comprising:
two ferromagnetic layers
an antiparallel coupling layer separating the two ferromagnetic layers having weekly coupled regions (WCR) therein: and
a means for inducing an applied magnetic field in the nearly balanced SAF structure, wherein the magnetoresistive memory cell is one of a plurality of a similarly constructed magnetoresistive memory cells of an integrated circuit.

23. The magnetoresistive memory cell according to claim 22, wherein a net moment difference of magnetic moments in the two ferromagnetic layers is not greater than 15 percent.

24. The magnetoresistive memory cell according to claim 22, wherein a normalized extrapolated remanence of the SAF structure is greater than zero.

25. The magnetoresistive memory cell according to claim 22, wherein a value of a flop field is significantly below the square root of the product of an anisotropy and a saturation of the SAF structure.

26. A synthetic antiferromagnetic (SAF) structure, comprising:

two ferromagnetic layers; and an antiparallel coupling layer separating the two ferromagnetic layers and having weakly coupled regions (WCR) therein, wherein a net moment difference of magnetic moments in the two ferromagnetic layers is not greater than 15 percent.

27. The synthetic antiferromagnetic (SAF) structure according to claim 26, wherein a normalized extrapolated remanence of the SAF structure is greater than zero.

28. The synthetic antiferromagnetic (SAF) structure according to claim 26, wherein a value of a flop field is significantly below the square root of the product of an anisotrophy and a saturation of the SAF structure.

* * * * *